United States Patent [19]

Norris et al.

[11] Patent Number: 5,453,957
[45] Date of Patent: Sep. 26, 1995

[54] MEMORY ARCHITECTURE FOR BURST MODE ACCESS

[75] Inventors: Christopher S. Norris, Sunnyvale; Timothy M. Lacey, Cupertino, both of Calif.

[73] Assignee: Cypress Semiconductor Corp., San Jose, Calif.

[21] Appl. No.: 123,377

[22] Filed: Sep. 17, 1993

[51] Int. Cl.$^6$ .................................. G11C 7/00; G11C 8/00
[52] U.S. Cl. .................................. 365/230.04; 365/230.02; 365/236; 365/239
[58] Field of Search .................. 365/230.04, 230.02, 365/239, 230.01, 236

[56] References Cited

U.S. PATENT DOCUMENTS

| | | | |
|---|---|---|---|
| 4,247,920 | 1/1981 | Springer et al. | 365/230.04 |
| 4,847,809 | 7/1989 | Suzuki | 365/230.04 X |
| 4,849,937 | 7/1989 | Yoshimoto | 365/230.04 X |
| 4,903,217 | 2/1990 | Gupta et al. | 364/521 |
| 4,924,375 | 5/1990 | Fung et al. | 364/200 |
| 4,991,110 | 2/1991 | Hannah | 364/518 |
| 5,121,354 | 6/1992 | Mandalia | 365/230.04 X |

*Primary Examiner*—Do Hyun Yoo
*Attorney, Agent, or Firm*—Blakely, Sokoloff, Taylor & Zafman

[57] ABSTRACT

The burst mode memory architecture using interleaved memory arrays provides even and odd EPROM arrays with data having even addresses stored in the even array and data having odd addresses stored in the odd array. A control circuit receives an initial address from a memory system controller and then accesses all data from the even and odd arrays within a burst address space containing the initial address. A pair of out-of-phase counters generate even and odd addresses, respectively, for accessing the even and odd arrays. Each counter increments addresses sequentially until a burst address space boundary is reached, then the counters wrap around to a beginning of a burst address space to generate any remaining addresses within a burst address space. The burst mode control circuitry is capable of processing a variety of burst sequencing modes. The burst address space size and the burst sequencing mode are selectable. A particular embodiment for generating an aligned sequential burst address sequence is described.

6 Claims, 4 Drawing Sheets

MEMORY ARCHITECTURE FOR BURST MODE ACCESS

BACKGROUND OF THE INVENTION

1. Field of the Invention

The present invention generally relates to computer memory systems, and in particular to an architecture and circuitry for memory chips using burst mode memory access.

2. Description of Related Art

Computer memory systems utilize various techniques for enhancing performance of the memory system. One such technique is "burst mode" memory access. A typical burst mode access begins when a memory controller applies an initial address within a burst address space to a memory chip in the memory system, and instructs the memory chip to load the address. After a specific, predetermined amount of time (usually 2 clock cycles), the memory chip responds with the data stored at the initial address. At the next clock cycle, the memory chip outputs data from a next address within the burst address space of the initial address. Typically, the addresses within the burst address space are accessed sequentially. For example, if the initial address applied to the memory chip is address 0, then after two clock cycles, the data from address 0 is available from the memory chip. Then, on the next single clock cycle, the memory chip delivers data from address 1, and on the next single clock cycle, the memory chip delivers data from address 2, and so on. Improved memory system performance is achieved since data is available on every clock cycle, after the initial address is presented to the memory chips.

Burst mode sequences are typically either "linear sequential" (e.g., AMD, and Motorola burst sequences) or "aligned sequential" (e.g., Intel burst sequences), and may have a burst address space of any size, although four-word and 256-word burst address space sizes are typical. For memory chips to be used for burst mode access, burst mode processing circuitry is provided directly on the memory chip. More specifically, a means is provided directly on the chip for loading the initial address, generating sequential addresses within the burst address spaces, and accessing the data at the initial and sequentially-generated addresses, based on a predefined burst mode sequence and burst addressing space size.

Thus, a typical prior art burst mode memory chip receives an initial address and internally advances the initial address according to a predefined burst mode address sequence and burst address space size. The chip then applies the burst address to a memory array to access data at each burst address location. Such prior art chips only access one location in memory array at a time and the delay in accessing the sequential data can be substantial. Furthermore, such chips are typically not user programmable. In other words, the burst mode sequence and the burst mode address size are not selectable. Rather each memory chip is uniquely designed to support only one burst mode sequence and only one burst address space size.

One example of a burst mode addressing system is an aligned sequential burst mode provided by Intel, hereinafter also referred to as the "Intel Burst Mode". In Intel Burst Mode, unlike sequential burst modes, addresses are not accessed in sequence, rather higher-ordered addresses are typically accessed before corresponding lower-ordered addresses. For example, for a burst space of four words, accessing may occur in the sequence of 1,0,3,2 or 3,2,1,0, with higher ordered addresses 1 and 3 being accessed before corresponding lower-ordered addresses 0 and 2, respectively. A problem occurs in generating the aligned sequential sequence of addresses based on an initially received address. To generate the sequence of addresses for an aligned sequential mode, an initially received address is typically exclusively ORed with the output of a binary up-counter which is always initialized to zero. Table I illustrates an example of the exclusive OR operation wherein the initial address is binary 11.

TABLE I

| | External Address | | Counter | | Internal Address | |
|---|---|---|---|---|---|---|
| Initial Address | 11 | ⊕ | 00 | = | 11 | 3 |
| 1st Burst | 11 | ⊕ | 01 | = | 10 | 2 |
| 2nd Burst | 11 | ⊕ | 10 | = | 01 | 1 |
| 3rd Burst | 11 | ⊕ | 11 | = | 00 | 0 |

As can be seen from Table I, an aligned sequential address sequence is achieved using the exclusive OR operation. However, to achieve the exclusive OR operation, a pair of exclusive OR logic gates are used within the memory system, resulting in at least one and one-half gate delays, often more.

A second general technique for enhancing memory chip performance is to provide interleaved memory arrays. A conventional interleaved memory provides an "even" memory bank and an "odd" memory bank. Data having even memory addresses are stored in the even memory bank. Data having odd memory addresses are stored in the odd memory bank. Hence, any two sequential memory locations are stored in separate memory banks. If the two sequential memory addresses are to be accessed, a first memory location is read from the first memory bank and, while the first memory bank is read, the second memory bank is pre-charged. Then, the second memory location is read from the second memory bank, while the first memory bank is pre-charged. Hence, if two sequential memory locations are accessed, the data stored at the locations may be fetched quickly without any intervening pre-charge cycles required for typical random access memory.

However, conventional interleaved memory systems do not necessarily provide optimal data output speed. If data addresses are not received and processed sequentially, then the advantages of providing interleaved memories is largely lost. As an example, some systems provide only for a statistical or probabilistic enhancement and processing time. One such exemplary system stores all data corresponding to even pages of memory in an even memory bank and all data corresponding to odd pages of memory in an odd memory bank. Two pages of memory are read in an interleaved manner by alternatingly accessing addresses from the even page memory bank and from the odd page memory bank. A first address occurring within the even page is received. If a subsequent address is received that is not in the next odd page, then the page containing the received address must be precharged. Thus, the advantages of the interleaving are greatly reduced because the system provides interleaved access only to addresses that occur within sequential pages.

It would be desirable to achieve the advantages of both burst mode memory access and interleaved memory access in a single memory chip, particularly for electrically programmable read-only memory (EPROM) chips, as well as for other memory devices such as flash erasable EPROMs (EEPROMs) or static random access memory (SRAM) chips. It would also be desirable to provide for aligned sequential burst access without the aforementioned gate delays inherent in prior art aligned sequential memory systems. It would also be desirable to provide a means to adjust or select the burst address space size and burst address sequencing mode.

SUMMARY OF THE INVENTION

A general object of the invention is to provide an improved memory system. A more particular object of the invention is to provide an improved architecture for memory chips used in a memory system supporting burst mode accesses. Another particular object of the invention is to provide an improved method or apparatus for generating aligned sequential memory addresses for use with interleaved memory arrays. Yet another object is to provide a means to select or adjust the burst address space size and the burst address sequence mode.

These and other objects are achieved by memory systems configured in accordance with the present invention. In one embodiment, the invention provides an interleaved memory system for accessing data, in burst mode, from a pair of memory arrays. The system includes a first array means for storing data having even addresses, a second array means for storing data having odd addresses, a means for receiving an initial address, and a burst means for alternatingly reading data from the first and second arrays for a plurality of addresses within a burst address space containing the initial address.

In a preferred embodiment, the first and second arrays are EPROM arrays. The burst means generates all addresses within the burst address space based on the initial address, a predetermined burst address space size and a predetermined burst address sequencing mode. The burst means includes a wrap-around capability whereby the burst means begins accessing data from the initial address and continues to a burst space boundary, then generates all other addresses within the burst address space defined by the initial address. Means may be provided for selecting the burst address space size and burst address sequencing mode.

In accordance with another aspect of the invention, a method is provided for achieving efficient burst mode access to interleaved memory arrays. The method comprises the steps of storing data having even addresses in a first memory array; storing data having odd addresses in a second memory array; receiving an initial memory address which is within one of a plurality of predetermined burst address spaces; and alternatingly reading data from the first and second arrays for a plurality of addresses within the burst address space containing the initial address.

In accordance with another aspect of the invention, an apparatus is provided for generating an aligned sequence of memory addresses. The apparatus includes means for receiving an initial address having a lowest ordered-bit. A counter means is connected to the input means for receiving a partial address having all bits of the initial address excluding the lowest ordered-bit and for incrementing the partial address to generate a sequence of partial addresses, each excluding the lowest ordered bit. A binary-increment means, connected to the input means, is provided for receiving the lowest ordered-bit and for sequential incrementing the lowest-ordered bit to generate a sequence of alternating bits. A combining means is connected to the counter means and to the binary-increment means for sequentially combining the alternating bits with each address of the sequences of partial addresses to generate a sequence of aligned sequential addresses.

The invention also provides a method for generating aligned sequential addresses. The method comprises the steps of receiving an initial address having a lowest ordered-bit; receiving a partial address excluding the lowest ordered-bit and incrementing the partial address to generate a sequence of partial addresses, each excluding the lowest ordered-bit; generating an alternating bit; and sequentially combining the alternating bit with each address of the sequence of partial addresses thereby generating a sequence of aligned sequential addresses.

In accordance with still yet another aspect of the invention burst mode memory systems are provided for generating addresses based on a selected burst address space size or on a selected burst address sequencing mode. One such system includes a means for selecting a burst address space size, means for receiving an initial address and means for generating addresses within a burst address space containing the initial address based on the selected burst address space size. Another such system provides means for selecting a burst sequencing mode, means for receiving an initial address, and means for generating addresses within a burst address space containing the initial address based on the selected burst sequencing mode. The burst address space size and the burst space sequencing mode may be user selectable.

In accordance with yet another aspect of the invention a burst mode memory system for generating all addresses within a burst address space is provided. The system comprises means for receiving an initial address, and means for generating addresses within a burst address space containing the initial address based on a predetermined burst address space size, wherein the means for generating addresses generates all address within the burst address space sequentially starting from the initial address and continuing to a burst address space boundary and then generates all remaining addresses in the burst address space.

In its various embodiments, the invention provides an improved memory architecture for processing burst mode address sequences to achieve high-speed output of data stored at those addresses. By providing an alternating even and odd sequence of addresses, and by internally generating all addresses within a given burst address space prior to moving on to a next burst address space, the system achieves high speed output of data. Additional speed enhancement is achieved by eliminating exclusive OR-gate delays which are inherent in certain prior art burst systems which generate aligned sequential address sequences. Furthermore, by allowing the burst address space size or the burst address sequencing mode to be selected a considerable improvement in flexibility is achieved over previous systems. Other advantages, features and objects of the invention will be apparent from the detailed description of the invention set forth below.

DETAILED DESCRIPTION OF THE INVENTION

Figure 1:
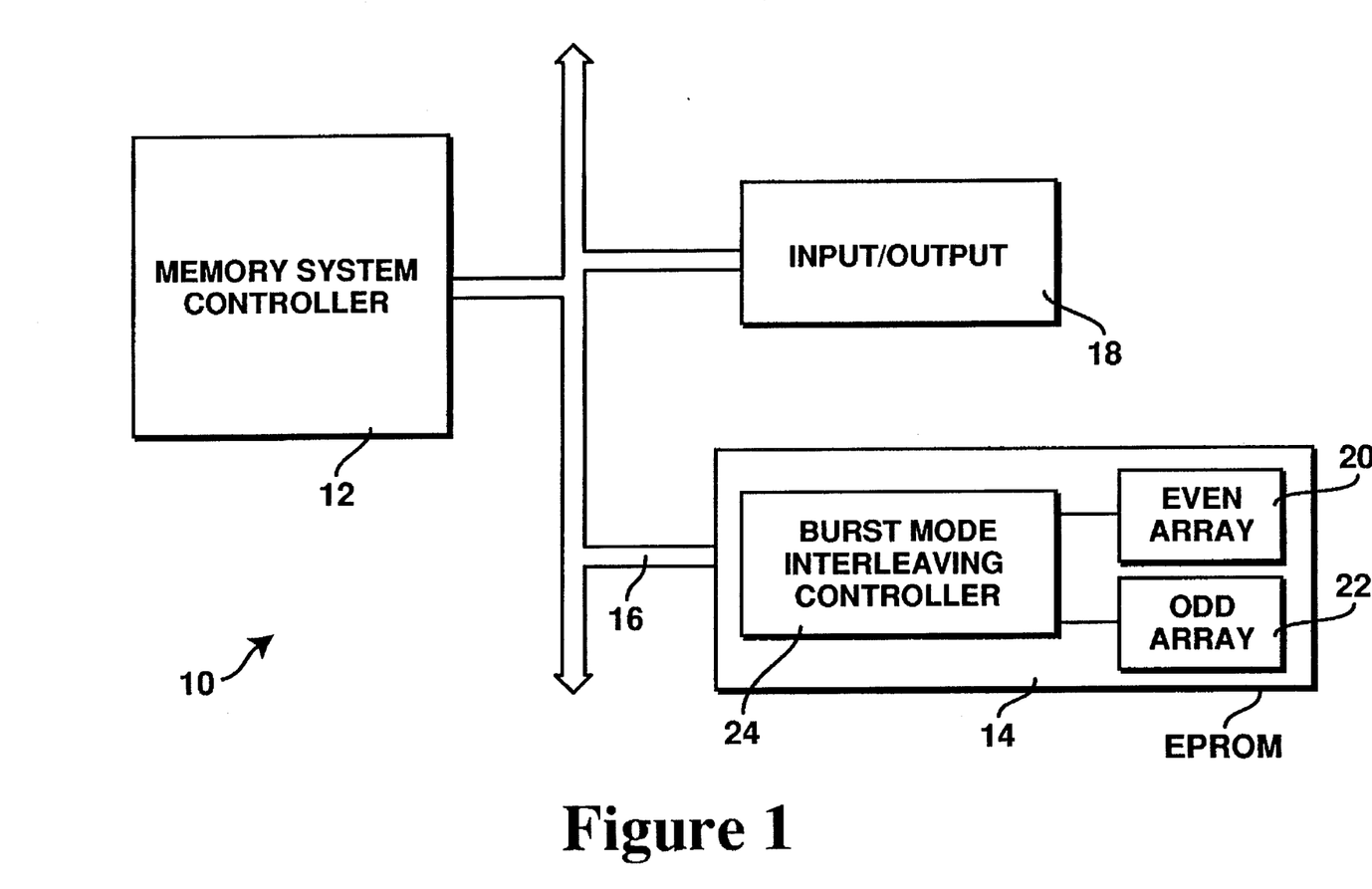
FIG. 1 is a block diagram of a memory system controller chip connected to a an input/output device and an EPROM memory device through a system bus, configured in accordance with a preferred embodiment of the invention.

Referring to FIGS. 1–4, preferred and alternative embodiments of the invention will now be described. FIG. 1 illustrates a computer system 10 having a memory system controller 12, an EPROM 14, and an interconnection bus 16. An input/output device 18 is also connected to the interconnection bus 16. EPROM 14 includes an even array 20 and an odd array 22 for respectively storing read-only data having even and odd memory addresses. EPROM 14 also includes a burst mode interleaving controller 24 which receives an initial burst mode address along bus 16 from memory system controller 12 and retrieves data from arrays 20 and 22 corresponding to all address within a burst address space containing the initial address. As will be described in more detail below, individual memory locations corresponding to a burst address space are interleaved between the odd and the even memory arrays. EPROM 14 operates to retrieve all memory locations within a burst address space in response to a single address received along bus line 16.

Figure 2:
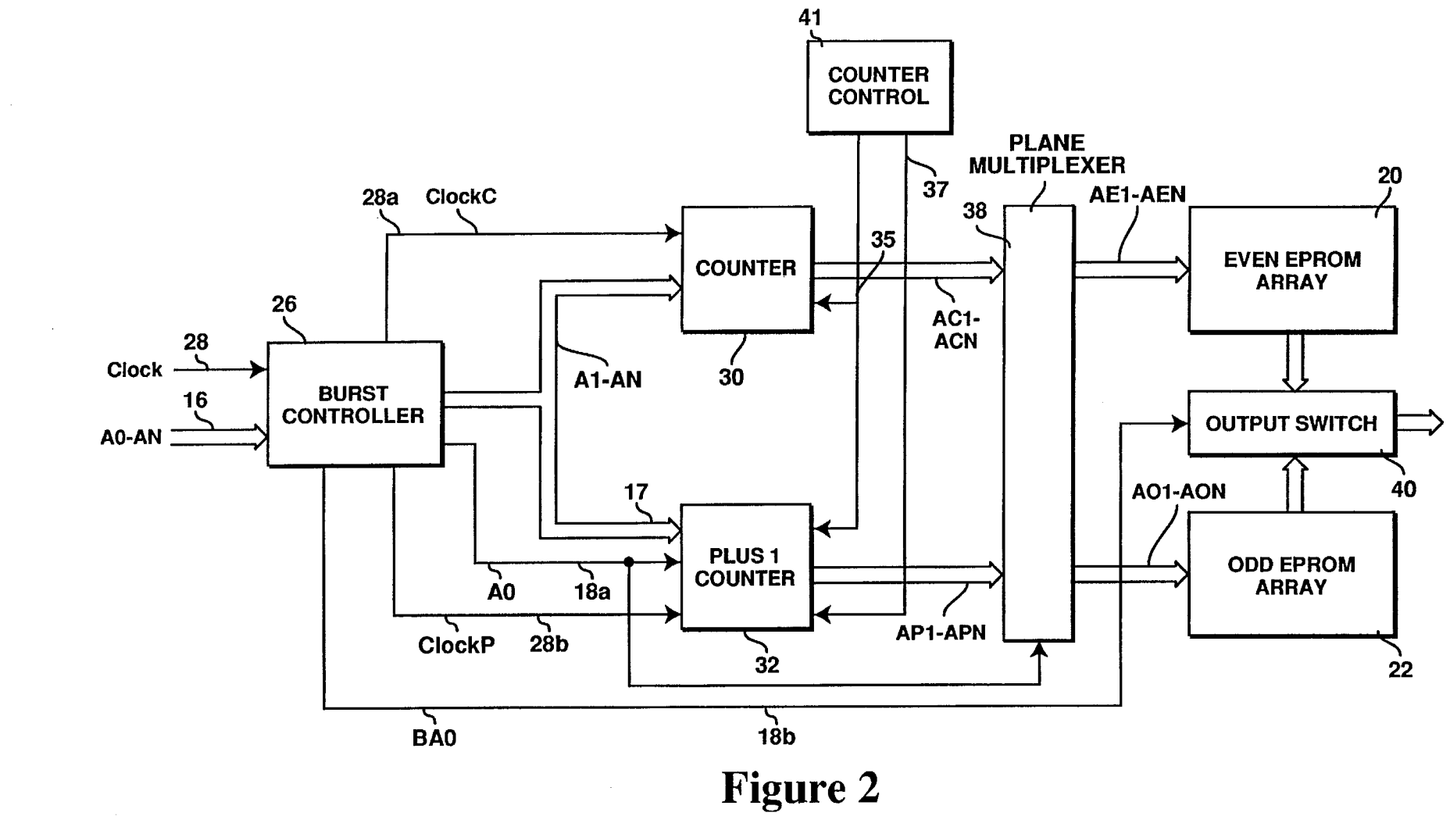
FIG. 2 is a block diagram of the EPROM of FIG. 1.

FIG. 2 illustrates an exemplary embodiment of EPROM 14 in greater detail. In particular, individual components of burst-mode interleaving controller 24 are shown in greater detail. Primary components of EPROM 14 include a burst controller 26, a counter 30, a plus-one counter 32, a plane multiplexer 38 and an output switch 40, in addition to the previously described even and odd memory arrays 20 and 22, respectively. Counter controller 21, which may be separate from EPROM 14, allows for selection of a particular burst sequencing mode as well as selection of a burst address space size. Operation of counter controller 41 will be described in further detail below.

An initial address is received along bus line 16. In the exemplary embodiment illustrated in FIG. 2, each address, which identifies a memory location of a single word within a burst address space, includes address bits denoted A0–AN. Address bits denoted A1–AN identify a memory location in both the odd and even EPROM arrays. The address bit denoted A0 determines the evenness or oddness of the address and is used to identify the array containing data corresponding to the address A0–A1.

The initial address is received and processed by a burst controller 26 which also receives a clock signal along line 28. The clock signal is generated by conventional means, not shown. Burst controller 26 outputs address bits A1–AN to counter 30 along a bus line 17 and to plus-one counter 32 also along line 17. Burst controller 26 also outputs a clock signal "ClockC" to counter 30 along a line 28a and outputs a clock signal "ClockP" to plus-one counter 32 along a second line 28b. ClockC is synchronized with the input clock signal but has a frequency of one-half that of the input clock signal. ClockP also has a frequency one-half that of the input clock signal but is out-of-phase from signal ClockC. Burst controller 26 also outputs bit A0 to plus-one counter 32 and to plane multiplexer 38 along line 18a. Burst controller 26 also outputs a modified bit BA0 to output switch 40 along a line 18b. Bit BA0 is generated by receiving initial bit A0 and incrementing bit A0 by one on each clock cycle of the input clock signal. In this manner, BA0 alternates between 1 and 0. As will be described more fully below, address bit A0 and modified bit BA0 are used to facilitate generation of all addresses within the burst address space containing the initial address received along bus line 16. A "mode control" signal is also received by burst mode interleaving controller 24 which indicates the type of burst mode, i.e. "aligned sequential", "linear sequential", etc. The mode control signal is received along line 37, from a counter control unit 41.

Counter 30 receives N address bits denoted A1–AN of the initial address received along bus line 16. Counter 30 outputs sequentially generated addresses AC1–ACN beginning at the initial address, with each sequential address being incremented by two. More specifically, counter 30 increments A1–AN by a binary one which effectively increments A0–AN by two. For example, if the initial address is even, counter 30 increments address A1–AN to generate a sequence of even addresses, beginning with A1–AN. The output of counter 30, AC1–ACN, is transmitted to plane multiplexer 38 which routes AC1–ACN to either even array 20 or odd array 22 depending upon whether AC1–ACN corresponds to an even or an odd address. A determination of whether AC1–ACN is even or odd is made based on the A0 bit received along line 18a directly from burst controller 26. If bit A0 is one, then all data output from counter 30 is odd. Hence partial address AC1–ACN is routed to odd array 22. In FIG. 2, the data routed between plane multiplexer 38 and odd array 22 is identified by partial address AO1–AON. If bit A0 is zero, then all addresses output from counter 30 are even. Hence, partial address AC1–ACN is routed to even array 20. In FIG. 2, all addresses routed from plane multiplexer 38 to even array 20 are identified by AE1–AEN.

Thus counter 30 merely provides a partial address AC1–ACN, which does not, by itself, provide any indication whether it corresponds to an even address or an odd address. Plane multiplexer 38 relies on the state of the A0 bit of the initial address received along bus line 16 to determine whether partial address AC1–ACN corresponds to an even or an odd address. Thus, if the initial address A0–AN is even, then all partial addresses AC1–ACN output from counter 30 are also even, and are thereby routed to even array 20. If initial address A0–AN is odd, then all partial addresses output from counter 30 are odd and are routed to odd array 22. The converse is true for partial addresses AP1–APN output from plus-one counter 32. The state of the A0 bit of the initial address does not change during the accessing of all addresses within the burst space. However, when a next "initial" address is received corresponding to a next burst space, the evenness and oddness of partial addresses provided by counter 30 and plus-one counter 32 may change.

The partial addresses AE1–AEN and AO1–AON sent to the even and odd arrays respectively, are used by the arrays to access data stored therein. An A0 bit is not required for input to either the even or odd arrays since the arrays contain either only even or only odd data. Hence, a partial N-bit address is sufficient to uniquely identify each memory location within the even or odd arrays. Data is output from even array 20 and from odd array 22 asynchronously. Output switch 40 passes data alternately from even array 20 and odd array 22 for output, with new data effectively output at each rising edge of the input clock signal (received along clock line 28) which controls BA0 that is connected to output switch 40.

Plus-one counter 32 receives bits A1–AN of the initial address along with bit A0. Plus-one counter 32 outputs sequentially generated addresses with each sequential address being incremented by two. As with the operation of counter 30, plus-one counter 32 achieves the incrementing of the overall address A0–AN by 2 by adding a binary 1 to the partial address, A1–AN. Unlike counter 30, plus-one counter 32 initially increments the overall address, A0–AN, by 1. (As will be described in more detail below, for certain sequencing modes, the A0 bit is forced into a low state prior to the initial increment by one, in other words, the A0 bit is set to zero before input to plus-one counter 32.) All subsequent incrementing by two is applied solely to the partial memory address A1–AN resulting from truncating the A0 bit after an initial increment by one. For example, if the initial address is even and for a linear burst sequencing mode, plus-one counter 32 initially adds one to A0–AN to generate a modified full address. Then, counter 32 generates a sequence of addresses based only on A1–AN of the modified address. (For certain sequencing mode, described below, no initial increment by 1 is required.) The operation of counter 32 is synchronized to clock signal "ClockP" received along line 28b. The operation of plus-one counter 32 will be described in further detail below with reference to FIG. 3.

In summary, if the initial address is odd, then counter 30 operates to generate a sequence of odd address, whereas plus-one counter 32 operates to generate a sequence of even addresses. Addresses output by counter 30 are routed through plane multiplexer 38 which selects the proper even or odd array, depending upon whether the initial address is even or odd as determined by the state of the A0 bit received along line 18a. Addresses output by plus-one counter 32 are also processed by plane multiplexer 38 and routed to the appropriate memory array.

Data retrieved by both the even and odd arrays are routed through output switch 40 onto output bus line 16 for transmission to memory system controller 12. Data is output from output switch 40 at each rising edge of both the ClockC and ClockP signals. In other words, data is output from output switch 40 at the rate of the clock signal received along the input line 28 with data alternatingly being provided either by even array 20 or odd array 22.

An example of the operation of the even and odd arrays will now be described for a linear sequential sequencing mode with an even initial address. Bits A1–AN of the initial address are loaded into counter 30 and output through plane multiplexer 38 into even array 20. Data accessed at that even address location is output from even array 20 through output switch 40. Hence data corresponding to the initial address is the first data to be output from output switch 40. All bits A0–AN are also applied to plus-one counter 32 which increments the overall address by 1 to generate an odd address corresponding to the first burst. Bits AP1–APN of the odd address are directed through plane multiplexer 38 to odd array 22 and data is subsequently set-up to the output switch. On the following cycle, BA0 increments causing odd data to pass through the output switch and the rising edge of clockC causes counter 30 to increment AC1–ACN. BA0 increments again which causes even array data to pass through the output switch. The rising edge of clockP causes counter 32 to increment AP1–APN and output the address through multiplexer 38 into odd array 22. This sequence repeats until all addresses within the burst address space are accessed.

Counter 30 increments the initial address by two to generate a second even address. The second even address is routed through multiplexer 38 to even array 20. Data retrieved from even array 20 at the second even address is then output through output switch 40. Plus one counter 32 increments the first odd address by two to generate a second odd address for routing to odd array 22. Counter 30 increments the second even address by two and so on. The use of out-of-phase clock signals ClockC and ClockP allow counters 30 and 32 to operate out-of-phase.

Multiplexer 38, even array 20, odd array 22 and output switch 40 are all asynchronous. However, the operation of switch 40 is effectively synchronized to the BA0 signal.

Also, the counters, multiplexer, arrays and output switch operate in sequence such that while a counter is outputting an incremented address, the multiplexer, arrays and output switch are operating on previously generated addresses within the same burst address space.

As noted above, output switch 40 operates to combine the partial addresses AE1–AEN or AO1–AON received from the even or odd arrays, respectively, with alternating bit BA0. Bit BA0 switches from 1 to 0 on each rising edge of the input clock signal. The value of BA0 is timed such that when combined by output switch 40 with the partial addresses, the resulting full address is properly either even or odd. In other words, partial addresses received through even array 20 are combined with bit BA0 when BA0 is set to 0. Partial addresses received from odd array 22 are combined with bit BA0 when bit BA0 is set to 1.

At subsequent clock cycles, counter 30 and plus one counter 32 output incremented partial addresses which are routed through plane multiplexer 38 to the appropriate even or odd arrays where data is fetched and output through output switch 40. Processing continues until all addresses within the burst address space defined by the initial address have been retrieved. As will be described more fully below, counter 30 and plus one counter 32 include wrap-around means for detecting a burst space boundary. Thus, for example, the system will access all data with in the burst space beginning at the initial address and continuing up to a burst space boundary, then wrap around to retrieve data from the lower addresses within the burst space. In this manner, all addresses within the burst space are accessed prior to receiving a second "initial" address.

Figure 3:
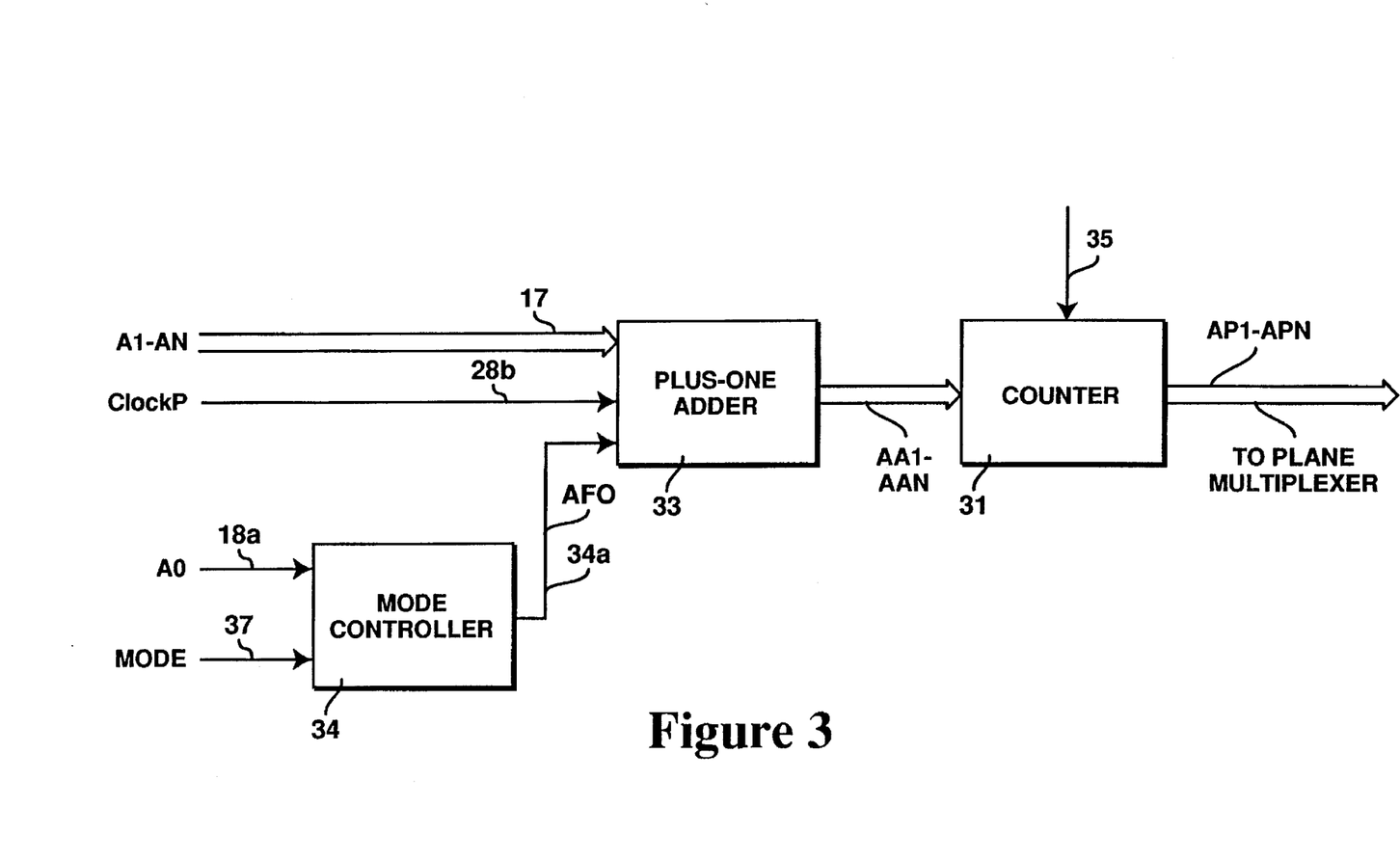
FIG. 3 is a block diagram of a plus-one counter of FIG. 2.

Referring to FIG. 3, plus-one counter 32 will now be described in greater detail. Plus-one counter 32 receives address bits A0–AN from burst controller 26. Plus-one counter 32 includes three main components a mode controller 34, a plus-one adder 33 and a counter 31. Partial address A1–AN is input directly to plus-one adder 33. Bit A0 is routed through mode controller 34 which, depending upon the value of a mode selection signal received along line 37, outputs an unmodified bit A0 or an A0 bit forced to zero. The bit output from mode controller 34 is identified by AF0. Thus, plus-one adder 33 receives a full address A0–AN, with the A0 bit possibly being reset to zero from its initial value. Plus-one adder 33 adds one to the full address received then outputs a partial address AA1–AAN to counter 31. Because plus-one adder 33 receives a full address including A0, the addition of one to the full address serves to increment the full address by one. Counter 31 also increments the address it receives by one. However, counter 31 receives only a partial address AA1–AAN. Hence, by incrementing AA1–AAN by one, counter 31 effectively increments the overall address by two. Counter 31 outputs a partial address AP1–APN to plane multiplexer 38 (FIG. 2).

It should be noted that, for modes wherein AF0 is set to 0, plus-one adder need not add one to the full address AF0:A1–AN, as such is not necessary. Rather, adder 33 need only pass bits A1–AN to counter 31 without any addition or modification. Thus, plus-one counter 32 can be implemented without a separate mode controller. In such an implementation, plus-one adder 33 receives bit A0 and the mode selection signal directly. If the mode selection signal indicates a sequencing mode where A0 is to be set to 0, such as aligned sequential, plus-one adder 33 merely passes A1–AN to counter 31 unmodified as bits AA1–AAN. If the mode selection signal indicates that a mode wherein A0 is not forced to 0, such as a linear sequential mode, then plus-one adder 33 combines A0 with A1–AN, adds one, and then transmits bits AA1–AAN to counter 31.

In either the embodiment illustrated in FIG. 3 or the alternative embodiment described above, the handling of the A0 bit by plus-one counter 32, in conjunction with counter 30 and output switch 40, effectively generates an aligned sequential address sequence without requiring the exclusive OR-gates described above in the Description of Related Art. The correct evenness or oddness of partial addresses output from counter 30 and plus-one counter 32 is maintained by applying the unmodified A0 bit of the initial address directly to plane multiplexer 38 (FIG. 2). After data is retrieved from the even or odd arrays and is ready for output from output switch 40, the full address from the data is reconstructed by combining the alternating BA0 bit provided along line 18b with the partial addresses AE1–AEN or AO1–AON. More specifically, for data retrieved from odd array 22, the corresponding odd address is reconstructed by combining AO1–AON with the BA0 bit which is set to one. For data received from even array 20, the corresponding full address is reconstructed by combining the partial AE1–AEN address with bit BA0 when bit BA0 is set to zero.

The effect of the aligned sequential mode is illustrated in Tables II, III, and IV which provide three examples of aligned sequential burst address sequences with a burst space size of 4 words. Each table contrasts a linear sequential burst with an aligned sequential burst, resulting from forcing A0 low during the aligned sequential address generation then recombining the addresses with bit BA0.

TABLE II

|  | Linear Sequential Burst | | Aligned Sequential Burst | |
| --- | --- | --- | --- | --- |
| Initial Address | 11 | 3 | 11 | 3 |
| 1st Burst | 00 | 0 | 10 | 2 |
| 2nd Burst | 01 | 1 | 01 | 1 |
| 3rd Burst | 10 | 2 | 00 | 0 |

TABLE III

|  | Linear Sequential Burst | | Aligned Sequential Burst | |
| --- | --- | --- | --- | --- |
| Initial Address | 01 | 1 | 01 | 1 |
| 1st Burst | 10 | 2 | 00 | 0 |
| 2nd Burst | 11 | 3 | 11 | 3 |
| 3rd Burst | 00 | 0 | 10 | 2 |

TABLE IV

|  | Linear Sequential Burst | | Aligned Sequential Burst | |
| --- | --- | --- | --- | --- |
| Initial Address | 00 | 0 | 00 | 0 |
| 1st Burst | 01 | 1 | 01 | 1 |
| 2nd Burst | 10 | 2 | 10 | 2 |
| 3rd Burst | 11 | 3 | 11 | 3 |

Table II contrasts a linear burst with an aligned sequential burst, with both generated from an input address having bits A1–A0 equal to "11". As noted above, the initial address and every second address thereafter is routed through counter 30, with counter 30 receiving and outputting partial addresses which exclude the lowest ordered bit A0 which, in this example, is only the A1 bit. The full address is reconstructed by combining the BA0 from burst control 26 bit with the partial address received from counter 30. Hence, if the initial address is odd, counter 30 processes the initial address and all remaining odd addresses within the burst space not generated by plus-one counter 32. Also as noted above, plus-one counter 32 generates all other addresses in the burst space. Thus, if the initial address is odd, plus-one counter 32 generates the next even address and all remaining even addresses within the burst space.

A left half of table II illustrates the A1 and A0 bits output by output switch 40 in response to an input address of "11" for a linear burst mode. As can be seen, a linear sequence of bits is provided, having a sequence of 3,0,1,2.

A right half of table II illustrates a corresponding aligned sequential sequence also beginning with an initial address of "11". As can be seen, an aligned sequence of 3,2,1,0 is provided.

Tables III and IV provide corresponding linear and aligned sequences for a initial address of "01" and for an initial address of "00". As with Table II the binary values set forth in tables III and IV represent the full addresses after recombination of intermediate partial addresses output from counters 30 and 32 with binary bit BA0.

The technique of employing a counter to generate a sequence of partial addresses which exclude the A0 bit, followed by recombining the partial addresses with a alternating BA0 bit, can be employed in a variety of applications, in addition to the interleaved memory architecture set forth in FIGS. 1, 2 and 3. In particular, separate counters, such as counter 30 and plus-one counter 32 of FIG. 2, are not required. Rather, a single counter may be employed.

Figure 4:
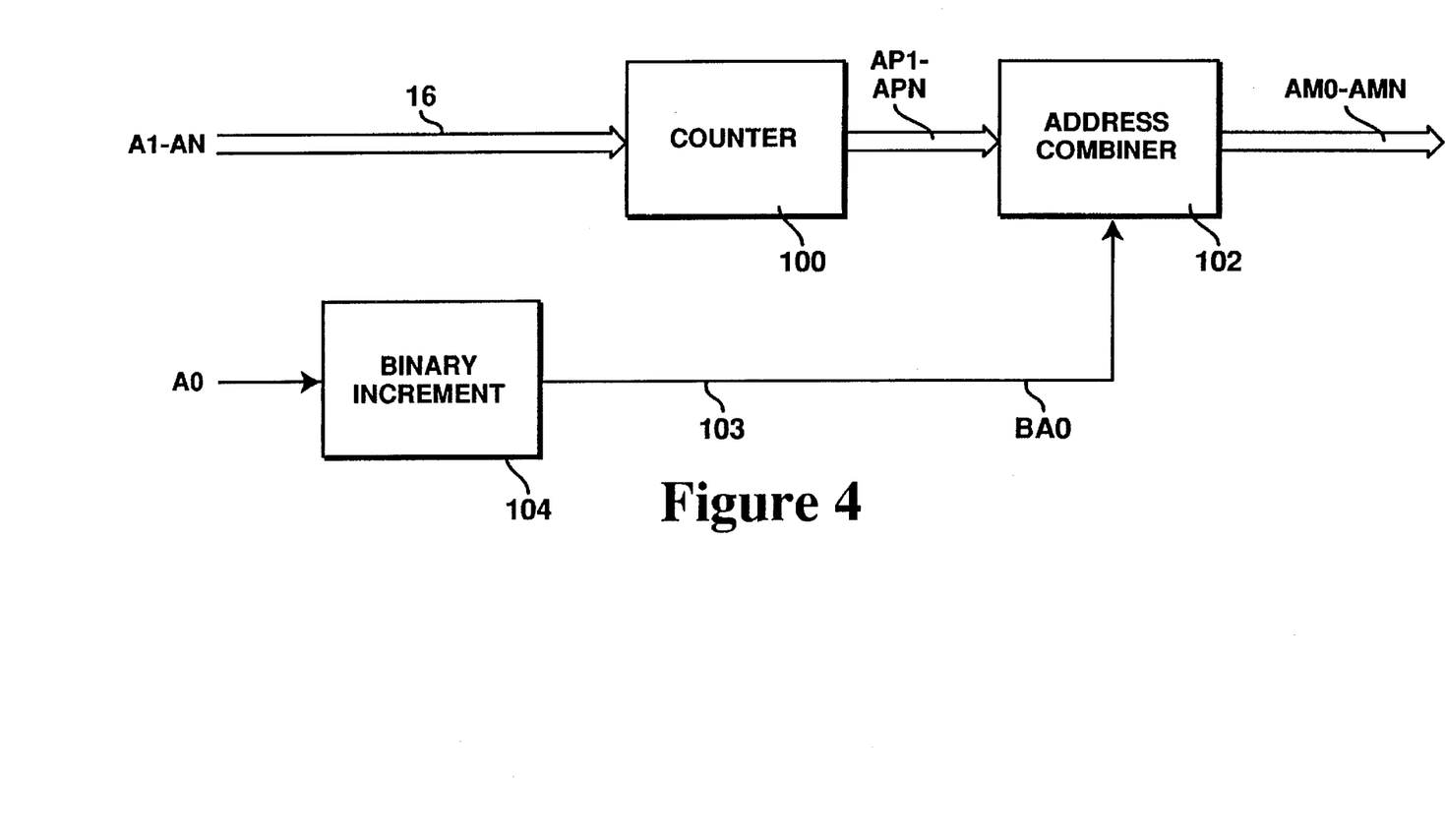
FIG. 4 is a block diagram of an alternative apparatus for generating aligned sequential memory addresses.

FIG. 4 illustrates an apparatus for generating an aligned sequential address which employs only a single counter 100 in combination with an address combiner 102 and a binary incrementer 104. Counter 100 receives a partial address of A1–AN which is internally converted to a full address, A0–AN with the A0 bit set to zero. Counter 100 then increments the full address by one. Thus, unlike the counters of FIGS. 2 and 3 which effectively increment a full address by two by actually incrementing a partial address, which excludes the A0 bit, by one, counter 100 of FIG. 4 increments a full address by one. Hence, whereas the counters of FIGS. 2 and 3 generate either only odd or even addresses, counter 100 of FIG. 4 generates both even and odd addresses. Although counter 100 internally employs a full address, including an A0 bit which is initially set to zero, counter 100 outputs only N bits, represented by AP1–APN. Binary incrementer 104 receives bit A0 of the initial address and increments bit A0 by on each clock cycle to generate an alternating bit which alternates between 1 and 0 on each clock cycle. The alternating bit, denoted BA0, is transmitted to address combiner 102 along a line 103. Address combiner 102 combines partial address AP1–APN with bit BA0 to generate a full output address, represented in FIG. 4 by a AM0–AMN.

The architecture illustrated in FIG. 4 may be used in connection with a non-interleaved memory array wherein separate generation of even and odd addresses is not necessary. Thus, the advantages of generating an aligned sequential address sequence without requiring the additional gate delays described above can be gained in a variety of memory architectures and generally in any application requiring the generation of aligned sequential addresses.

It should be noted that the architecture of FIG. 4 is configured for generating only aligned sequential addresses, and does not include a capability to alternatively generate other sequence modes.

Referring again to FIG. 1–3, further aspects of the interleaved memory architecture will now be described.

Counter 30 and counter 31 both each include wrap-around circuitry that causes the respective counter to reset when the burst address space boundary is ready to be crossed. Information regarding the burst address space, including the burst address space size, is transmitted to each counter along line 35 from counter controller 41. If a next incremental address is not within the original burst address space, the wrap-around circuitry resets the counter to a lowest address which is within the burst address space, e.g. "0000". The upper burst space boundary is defined by an address having all ones, e.g. "1111." (It should be noted that counters 30 and 33 do not operate on the lowest ordered bit, hence the comparison between the addresses generated by the counters and the upper address boundary is based on only bits A1–AN.) Thereafter, counter 30 and counter 31 incrementally generate all remaining addresses within the burst address space up to the initial address. In this manner, all addresses within a particular burst address space are fetched from the even and odd EPROM arrays before addresses from a second burst space are fetched (corresponding to a second "initial" address received from memory system controller 12 of FIG. 1). As can be appreciated, because all addresses within a burst space are accessed with individual addresses alternatingly fetched from the even and odd array, output of the entire burst address space occurs at high speed.

The wrap control circuitry provided within each counter can consist of a "lookahead" circuit that compares the output of each stage of the counter (i.e., each bit in the binary address being incremented) and resets the counter when all bits are set to "1". Since the counters advance the address A1–AN by one (or, equivalent, A0–AN by two), the counters effectively do not make use of A0 when advancing the address.

As noted, counter controller 41 provides signals indicating the burst address space size to the counters along line 35 for use in determining when wrap-around should occur. The burst address space size signals may alternatively be received through bus 16 (FIG. 1) or through other conventional means. Preferably, the burst address space size is programmer selectable. Counter controller 41 also provides the mode selection signal to the mode controller of plus-one counter 32 along line 37. Any circuitry required to implement counter controller 41 is provided in accordance with conventional hardware or software techniques. Depending upon particular implementations, input/output device 18 (FIG. 1) may be employed for allowing a user to input a burst sequencing mode and a first address space size, possibly within the parameters of the computer program for controlling operation of EPROM 14. As can be appreciated, any signals needed to implement the selectable burst size or address sequencing mode may be routed through, or generated by, memory system controller 12 (FIG. 1). Furthermore, in addition to allowing the user selection of the burst address space size and of the burst address sequencing mode, the EPROM chip of the invention can be configured to allow a manufacturer to set these parameters, perhaps by employing additional EPROM memory cells, prior to shipment to end users. Hence, the selectability of the burst address space and the sequencing mode is not limited solely to the end user but such selections may, for particular applications, be reserved to the manufacturer or vendor. Other methods for selecting burst address size or burst address sequencing mode may employ any memory element, a fuse element, or even a change in one or more processing steps that hooks up counter control or counters differently.

What has been described is an architecture for memory chips using burst mode access, implemented using interleaved memory arrays. The invention has been primarily described with reference to aligned sequential and linearly sequential burst address generation, but the invention is equally applicable to other burst mode sequences. The invention provides for high-speed access to data stored in EPROM memory arrays (or other similar memory devices). By accessing addresses in a burst address sequence using interleaved memory arrays, high-speed access is assured, i.e., high-speed access is deterministic rather than merely statistical or probabilistic. As such, an EPROM memory chip, configured in accordance with the principles of the invention, is ideally suited for many applications requiring high-speed access to read-only memory. Other objects of the invention set forth above are also achieved by implementing aspects of the invention. The EPROM chips of the invention are preferably designed and configured using conventional VLSI design and fabrication techniques.

Also, although illustrated with reference to particular exemplary embodiments, these embodiments are merely illustrative of the invention and should not be taken as limiting the scope of the invention.

What is claimed is:

1. A memory system for storing data, said system comprising:

a first array storing data having even addresses;

a second array storing data having odd addresses;

an input line receiving an initial memory address, said initial memory address being within a predetermined burst address space; and a burst processing circuit, connected to said input line and to said first and second arrays, said burst processing circuit alternatingly reading data from said first and second arrays, for a plurality of addresses within said burst address space containing said initial memory address, wherein said burst processing circuit comprises:

a first counter connected to said input line which provides said initial memory address, said first counter controlled by a first clock signal;

an adder connected to said input line;

a second counter connected to said adder, said second counter controlled by a second clock signal, said second clock signal being out of phase with said first clock signal; and a plane multiplexer connected to outputs of said first and second counters for transmitting an address received from one of said first and second counters to one of said first and second arrays, said first array receiving said even addresses, said second array receiving said odd addresses.

2. A memory system for storing data, said system comprising:

a first array storing data having even addresses;

a second array storing data having odd addresses;

an input line receiving an initial memory address with a lowest ordered-bit, said initial memory address being within a predetermined burst address space; and a burst processing circuit, connected to said input line and to said first and second arrays, said burst processing circuit alternatingly reading data from said first and second arrays for a plurality of addresses within said burst address space containing said initial memory address, wherein said burst processing circuit comprises a counter, connected to said input line, for receiving a partial address having all bits of said initial memory address excluding said lowest ordered-bit and for incrementing said partial address to generate a sequence of partial addresses, each partial address excluding the lowest ordered bit;

a binary-increment element, connected to said input line, for receiving said lowest ordered-bit and for sequentially incrementing said lowest-ordered bit to generate a sequence of alternating bits; and a combining element, connected to said counter and to said binary-increment element, for sequentially combining said alternating bits with each partial address within said sequence of partial addresses to generate a sequence of aligned sequential addresses.

3. A memory system for storing data, said system comprising:

a first array storing data having even addresses;

a second array storing data having odd addresses;

an input line receiving an initial memory address with a plurality of bits including a lowest-ordered-bit, said initial memory address being within a predetermined burst address space; and a burst processing circuit, connected to said input line and to said first and second arrays, said burst processing circuit alternatingly reading data from said first and second arrays for a plurality of addresses within said burst address space containing said initial memory address, wherein said burst processing circuit comprising:

a first counter, connected to said input line, for receiving a partial address having all bits of said initial memory address excluding said lowest-ordered bit and for repeatedly adding a binary 1 to said partial address to generate a first sequence of partial addresses;

a mode selection element for selecting between a linear sequencing mode and an aligned sequential sequencing mode;

a bit switching element for receiving said lowest ordered bit and for forcing said lowest ordered bit to 0, if said aligned sequential mode is selected;

an adder, connected to said input line, for receiving the partial address having all bits of said initial memory address excluding said lowest-ordered bit and for combining said partial address with the lowest ordered bit received from said bit switching element, and for adding a binary 1 to a resulting combined address to generate a modified address;

a second counter, connected to said adder, for receiving said modified address from said adder excluding a lowest ordered bit of said modified address and for repeatedly adding a binary 1 to the modified address to generate a second sequence of partial addresses;

a plane multiplexer, coupled to said first and second counters to receive said first and second sequences of partial addresses, for transmitting an address being within one of said first and second sequences of partial addresses to one of said first and second arrays, said first array receiving said even addresses, said second array receiving said odd addresses.

4. A method for storing data, said method comprising the steps of:

storing data having even addresses in a first memory array;

storing data having odd addresses in a second memory array;

receiving an initial memory address with a lowest ordered-bit, said initial memory address being within a predetermined burst address space;

passing a partial address, having all bits of said initial memory address excluding said lowest ordered-bit, through a first counter controlled by a first clock signal;

passing said partial address through an adder;

passing an address output by the adder through a second counter, the second counter controlled by a second clock signal, the second clock signal being out of phase with said first clock signal; and passing output address from the first and second counters through a plane multiplexer which transmits an address received from one of the first and second counters to one of the first and second memory arrays with the first memory array receiving said even addresses, and the second memory array receiving said odd addresses.

5. A method for storing data, said method comprising the steps of:

storing data having even addresses in a first memory array;

storing data having odd addresses in a second memory array;

receiving an initial memory address with a plurality of bits including a lowest-ordered-bit, said initial memory address being within a predetermined burst address space;

generating a partial address having all bits of said initial memory address excluding said lowest ordered bit and repeatedly adding a binary 1 to said partial address to generate a first sequence of partial addresses;

receiving a mode selection signal identifying a linear sequencing mode or an aligned sequential mode;

switching said lowest ordered bit to 0, if in the aligned sequential mode;

receiving the partial address having all bits of said initial memory address excluding said lowest ordered bit, combining said partial address with the lowest ordered bit which is set to 0 for the aligned sequential mode and adding a binary 1 to a resulting combined address to generate a modified address;

receiving said modified address and repeatedly adding a binary 1 to the modified address to generate a second sequence of partial addresses;

transmitting an address being within one of the first and second sequences of partial addresses to one of the first and second memory arrays with the first memory array receiving said even addresses, and the second memory array receiving said odd addresses.

6. A method for storing data, said method comprising the steps of:

storing data having even addresses in a first memory array;

storing data having odd addresses in a second memory array;

receiving an initial memory address with a lowest ordered-bit, said initial memory address being within a predetermined burst address space;

receiving a partial address excluding said lowest ordered-bit and incrementing said partial address to generate a sequence of partial addresses, each partial address excluding the lowest ordered-bit;

generating an alternating bit; and sequentially combining said alternating bit with each partial address within said sequence of partial addresses thereby generating a sequence of aligned sequential addresses.

* * * * *